United States Patent [19]

Miles et al.

[11] 4,225,877
[45] Sep. 30, 1980

[54] INTEGRATED CIRCUIT WITH C-MOS LOGIC, AND A BIPOLAR DRIVER WITH POLYSILICON RESISTORS

[75] Inventors: Steven W. Miles, Dudley; Paul R. Emerald, Sterling, both of Mass.

[73] Assignee: Sprague Electric Company, North Adams, Mass.

[21] Appl. No.: 939,506

[22] Filed: Sep. 5, 1978

[51] Int. Cl.² .................................... H01L 27/02
[52] U.S. Cl. ............................... 357/41; 357/42; 357/43; 357/48; 357/51; 357/59
[58] Field of Search ................. 357/41, 42, 43, 48, 357/51, 59

[56] References Cited

U.S. PATENT DOCUMENTS

| | | | |
|---|---|---|---|
| 3,432,792 | 3/1969 | Hatcher | 357/43 |
| 3,447,046 | 5/1969 | Cricchi | 357/43 |
| 3,576,475 | 4/1971 | Kronlage | 357/43 |
| 3,865,649 | 2/1975 | Beasom | 357/43 |
| 4,143,391 | 3/1979 | Suzuki et al. | 357/42 |

OTHER PUBLICATIONS

Solid State Electronics—1973—vol. 16—pp. 701-708—King et al., "Polysilicon . . . Resistors . . .".

Primary Examiner—Edward J. Wojciechowicz
Attorney, Agent, or Firm—Connolly and Hutz

[57] ABSTRACT

An integrated circuit includes MOS transistors and bipolar transistors, each of both polarity types, in a silicon wafer. High value polysilicon resistors are formed over an outer protective silicon dioxide layer of the silicon wafer, which resistors are rendered conductive by having ion implanted impurities concentrated near the outer surface of the polysilicon body, permitting achievement of close tolerance resistors. The process for making the integrated circuit includes forming a sheet of polysilicon over the entire wafer surface, performing the ion implantation and etching away all but the desired resistor portions of the polysilicon. It also includes heating the wafer to simultaneously anneal the ion implanted polysilicon, form the gate oxide, thicken the oxide over the emitters, and cover the resistor body with a thin protective oxide film.

7 Claims, 6 Drawing Figures

INTEGRATED CIRCUIT WITH C-MOS LOGIC, AND A BIPOLAR DRIVER WITH POLYSILICON RESISTORS

BACKGROUND OF THE INVENTION

This invention relates to an integrated circuit with C-MOS logic and a bipolar driver having ion-implanted polysilicon resistors, and more particularly to such a circuit wherein the implanted ions in the polysilicon are concentrated near the outer surface.

It is known to combine in an integrated circuit C-MOS logic circuitry with bipolar transistors to achieve economy of size. It is also known to form doped polysilicon resistor films over bipolar integrated circuits. However, the achievement of high yields in the manufacture of integrated circuits having close tolerance polysilicon resistors has not heretofore been possible, a ±40% on resistance value being about as good as could be made reliably.

It is an object of this invention to provide an integrated circuit including C-MOS transistor logic and bipolar drivers including PNP and NPN transistors and polysilicon resistors, capable of being manufactured with high yields and low cost.

SUMMARY OF THE INVENTION

An integrated circuit is made on a P-type silicon crystal wafer having grown on a face thereof an epitaxial layer of N-type. Electrical components formed in the epitaxial layer include a complimentary pair of MOS transistors, a PNP transistor and a NPN transistor. An insulative film such as silicon dioxide overlies the surface of the epitaxial layer and a polysilicon resistor is formed over the insulative film. The PNP transistor, NPN transistor and pair of MOS transistors are formed in a first, second and third pocket of the epitaxial layer which pockets are electrically isolated from one another, either by dielectric isolation or by P-type isolation walls. The N-channel transistor of the MOS pair includes a P-type well or channel region extending completely through the epitaxial layer to provide a broad electrical connection between the channel region and the wafer. The N-channel transistor may include a shallow heavily doped annular surface region of P-type at the interface between the P-type well region and the surrounding N-type epitaxial layer. The P-channel transistor of the MOS pair has spaced source and drain regions of P-type at the epitaxial surface. The PNP transistor has at the surface a P-type emitter region and spaced outwardly therefrom is an annular P-type collector region. The NPN transistor has at the surface a base region of the one type and an emitter region of the opposite type formed at the base region. The resistor is comprised of a polysilicon layer that contains ion implanted impurities, which impurities extend from the outer surface of the polysilicon layer and substantially only part way through the polysilicon layer. Integrated circuits that include the above described components possess an unusual combination of advantages for use where it is desired to provide logic circuitry intimately connected to high voltage drivers in a single package. The ion implanted polysilicon resistors can be made with high yields to resistance tolerance specifications of as little as ±25. Further, these resistors can have high resistance values and may be placed anywhere over the insulative film covering the integrated circuit. These resistors are further capable of sustaining voltages of hundreds of volts and are particularly useful as hold down resistors in bipolar driver circuits. In addition, the overall volume efficiency or packing density of an integrated circuit of this invention is very high.

The method for making the integrated circuit of this invention includes growing the epitaxial layer, providing the isolation walls, and selectively doping the epitaxial layer from the outer surface to form the transistors in the pockets. An insulative film is then formed on the surface and a sheet of polysilicon is deposited over the entire surface of the film. Subsequently the polysilicon sheet is built by ion implantation so that substantially all of the implanting ions remain within the sheet thus substantially none of the high energy ions reach the underlying insulative film. Then portions of the sheets are selectively removed to form an ion implanted polysilicon resistor body. The wafer is heated to anneal the ion implanted polysilicon resistor body and to simultaneously grow an oxide over the gate region of the MOS transistors. At the same time a protective oxide film is grown over the polysilicon resistor body. Aluminum film electrical connections are then made to the resistors and the transistors, after which an insulative protective layer such as glass may be formed over the resistor, aluminum connections, and epitaxial surface. This process is marked by a small number of steps each of which is minimally restrictive of the others. The use of the polysilicon sheet to avoid bombardment of the underlying insulative layer provides a highly efficient mask at ion implantation and eliminates the more conventional masking steps. The heating step for annealing the ion implanted polysilicon not only additionally serves as the conventional "emitter drive" step but also simultaneously forms the critically thick high quality gate oxide for the MOS transistor and may provide a protective oxide over the resistor body.

The protective oxide over the resistor body will permit aluminum connecting films to cross over the resistor body. However, the growth of such a silicon dioxide film over the resistor body consumes a layer of ion implanted polysilicon. Thus, it may be desirable in some cases to avoid growing a silicon dioxide film over the resistor body by performing the above noted anneal in an inert atmosphere and in a separate step from the oxidation of the gates. In this case the resistors can be made with high yield to an even smaller tolerance such as ±15%. Furthermore, higher sheet resistivity bodies are then possible.

DESCRIPTION OF THE PREFERRED EMBODIMENTS

Figure 1:
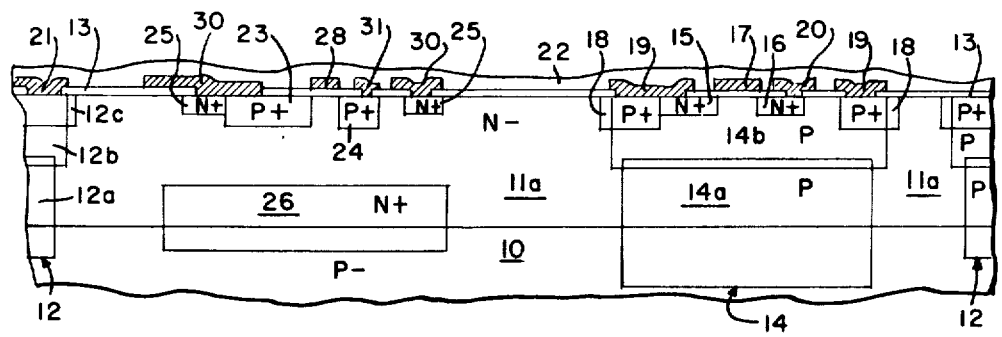
FIG. 1 shows in side sectional view a complementary pair of MOS transistors formed in a portion of an integrated circuit of this invention.

In FIGS. 1 through 4 there are shown a number of components formed on a P-type crystalline silicon wafer 10. On the top face of the wafer 10 there has been grown an N-type epitaxial layer 11. The active components shown in FIGS. 1 through 4 are formed in pocket regions, i.e. 11a, 11b and 11c of the epitaxial layer 11. These pocket regions are electrically isolated from one another by P-type isolation walls 12 which extend from the top or outer surface of the epitaxial layer 11 through the epitaxial layer to the wafer 10. These walls 12 are comprised of three portions, namely an upwardly extending buried layer portion 12a, a downwardly extending portion 12b that overlaps the buried layer 12a, and a shallow heavily doped contact portion 12c at the surface. A silicon dioxide layer 13 overlies the outer surface of epitaxial layer 11.

Although the above described downward diffused and upward diffused structure of the isolation walls is preferred in the practice of the present invention because it minimizes the total time-temperature exposure of other doped regions, other isolation wall structures may be used including an upward diffused or a downward diffused wall extending completely through the epitaxial layer 11. Alternatively dielectric isolation may be used.

An N-channel MOS transistor, as shown at the right hand side of FIG. 1, is formed in pocket 11a, and has located centrally therein a P-type well region 14 extending completely through the epitaxial layer pocket 11a. Well-region 14 is comprised of an upwardly extending buried layer portion 14a and a downwardly extending portion 14b that overlaps the buried layer portion 14a.

Figure 3:
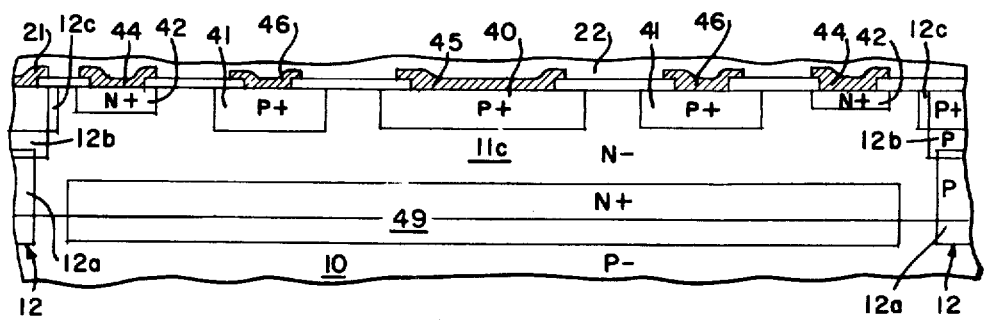
FIG. 3 shows in side sectional view yet another portion of the integrated circuit having a PNP transistor formed therein.

Two spaced shallow N-type regions 15 and 16 serve as the source and drain regions, respectively. A conductive aluminum film 17 serving as the gate electrode is over the oxide layer 13 and is registered with the space between the source and drain regions 15 and 16. A shallow annular surface region 18 is formed at the interface between the well 14 and the pocket 11a, having a higher concentration of P-type impurities than well portion 14b so as to decrease the resistance of the P-well and to prevent inversion at the junction between the P-well and the adjacent pocket 11a. The concentration of N-type impurities in the epitaxial layer 11 is preferably on the order of $10^{15}$ atoms/cm$^3$ to achieve optimum properties in the NPN transistor to be described (FIG. 3). The light concentration of P-type impurities in the well portion 14b is about $5 \times 10^{16}$ atoms/cm$^3$ at the surface to provide the necessary threshold voltage in the N-channel transistor.

Regions 15 and 18 are contacted by aluminum film 19. Drain region 16 is contacted by aluminum conductor 20 and wall 12 is contacted by aluminum conductor 21. A protective glass layer 22 overlies the aluminum oxide film 13 and the metallization (e.g. 17, 19, 20 and 21). Other passivating materials such as polyimide or silicon nitride may be used instead of glass.

A P-channel MOS transistor, as shown at the left hand side of FIG. 1, is also formed in epitaxial pocket 11a, as are all other MOS transistors (not shown) that may also be included elsewhere in the epitaxial layer. Two spaced shallow P-type regions 23 and 24 serve as the source and drain, respectively. A shallow annular N-type guard ring 25 is formed at the surface of pocket 11a, enclosing at the surface the source and drain regions 23 and 24, and serves as a conventional Chan-stop as well as a low ohmic contact region for the pocket 11a. An N-type buried layer 26 extends part way into pocket 11a from the wafer 10 beneath the source 23 and drain 24 to reduce the possibility of a parasitic PNP transistor, e.g. regions 24, 11a and 10.

A conductive aluminum film 28 serves as the gate electrode, lies over the oxide layer 13 and is registered with the space between the source and drain regions 23 and 24. Another aluminum film 30 contacts both the source region 23 and the guard ring 25. Yet another aluminum film 31 contacts the drain region 24.

Figure 2:
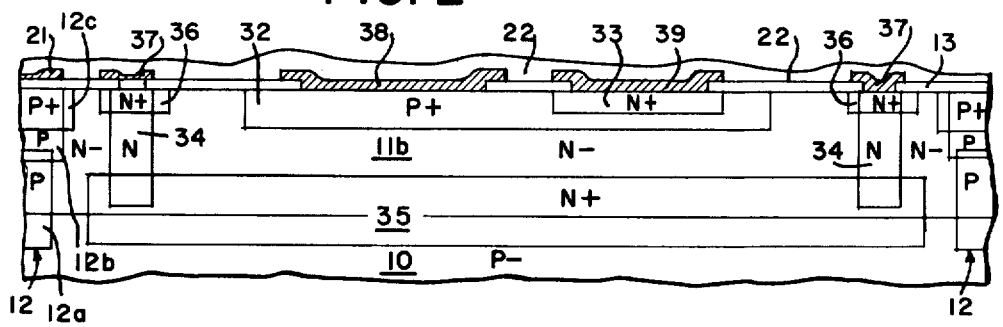
FIG. 2 shows in side sectional view another portion of the integrated circuit having an NPN transistor formed therein.

An NPN transistor, as shown in FIG. 2, is formed in the epitaxial pocket 11b. This transistor has a P-type base region 32 centrally located at the surface of the pocket 11b. An N-type emitter region 33 is formed within the base region at the surface. An N-type annular guard plug 34 extends from the surface through the epitaxial pocket 11b and overlaps a buried layer 35 that extends from the wafer 10 part way into the pocket 11b overlapping the annular plug 34 so as to be spaced from and completely enclose the base region 32. A shallow annular region 36 having a high concentration of N-type impurities is superimposed over the plug region 34 at the surface and an aluminum film 37 making contact with region 36 serves as the collector lead for the transistor. Other aluminum films 38 and 39 contact the base region 32 and emitter region 33, respectively.

The plug 34 serves to prevent inversion of surface portions of pocket 11b that may occur as a result of conductors (not shown) overlying the oxide layer 13 near such surface portions, which conductors have a more negative charge than that of the pocket 11b. This is the well known Chan-stop function. The plug 34 extending to overlap the buried layer 35 also serves to more effectively block the creation of a parasitic PNP transistor formed by regions 32, 11b and 12 (or 10), respectively; and further serves to reduce the collector resistance.

A PNP transistor, as shown in FIG. 3, is formed in pocket 11c. A shallow P-type region 40 is located at the surface centrally within pocket 11c, serving as the emitter. A shallow annular P-type region 41 is spaced from and surrounds the emitter region 40 at the surface, serving as the collector. A shallow annular region 42 having a high concentration of N-type impurities lies at the surface outside of and spaced from the annular collector region 41. An aluminum film 44 contacts region 42 and serves as the base lead of the transistor. Other aluminum films 45 and 46 contact the emitter and collector regions 40 and 41, respectively.

Figure 4:
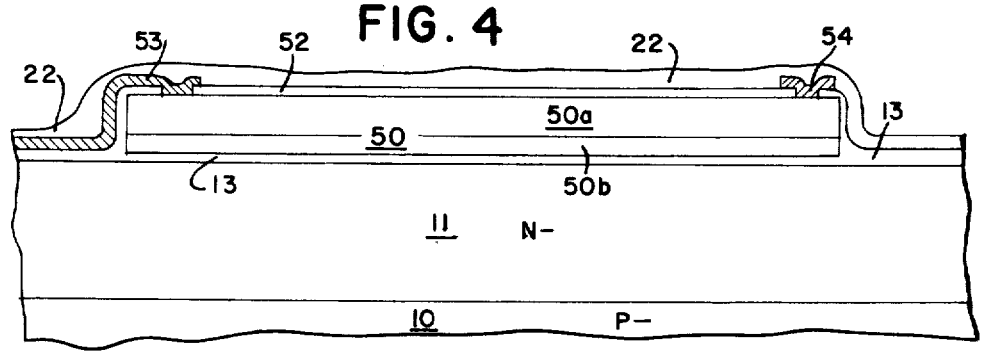
FIG. 4 shows in side sectional view a portion of the integrated circuit having an ion implanted polysilicon resistor

A polysilicon resistor illustrated in FIG. 4 is formed in a polysilicon body 50 that is formed over the silicon dioxide layer 13. An outer conductive layer portion 50a of the body 50 contains ion implanted impurities. A silicon dioxide layer 52 covers body 50 and has two holes therein through which aluminum films 53 and 54 contact the conductive layer 50a.

The process by which the integrated circuit described above is manufactured includes the following steps performed in the order presented.

The P-type wafer 10 is oxidized to form a temporary silicon dioxide layer over all surfaces, holes are opened in this layer in areas corresponding to the desired locations of the N-type buried layers (e.g. regions 26, 35 and 49). N-type impurities, antimony, are deposited at the face of the wafer 10, through the holes. This silicon dioxide masking layer is chemically stripped off and a second masking oxide layer is formed in a similar manner, holes being provided therein through which to selectively deposit P-type impurities, boron, at the face of the wafer in areas corresponding to locations of the P-type buried layers (e.g. regions 12a and 14a). The second masking layer is then removed.

The epitaxial layer 11 is grown over the above mentioned wafer face by a well known method of heating and exposing the wafer 10 to a gaseous mixture containing a silicon precursor compound (silicon tetrachloride) and a gaseous precursor of N-type impurities (phosphine).

A silicon dioxide mask is formed over the surface of the epitaxial layer 11, and the aforementioned downward extending P-type regions (e.g. 12b and 14b) are performed by a standard ion implantation predeposition step. Boron is chosen as the dopant.

After removing the last mentioned mask, a new mask is formed and N-type impurities are thereby selectively diffused into the wafer by a standard procedure of heating the wafer and passing over it a gas containing the impurities to preform the guard plug 34. Similarly after removing the last mentioned mask, boron is selectively diffused into the wafer to form the P-type base region 32 as well as regions 12c, 18, 23, 24, 40, 41 and any diffused resistors that may be required in the circuit (not shown). In the same manner phosphorous is selectivey diffused to form emitter region 33 as well as other shallow N-type regions 15, 16, 25, 36 and 42. A short oxidation step is then performed to cover the emitter 33 and the other exposed N-type areas.

Figure 5:
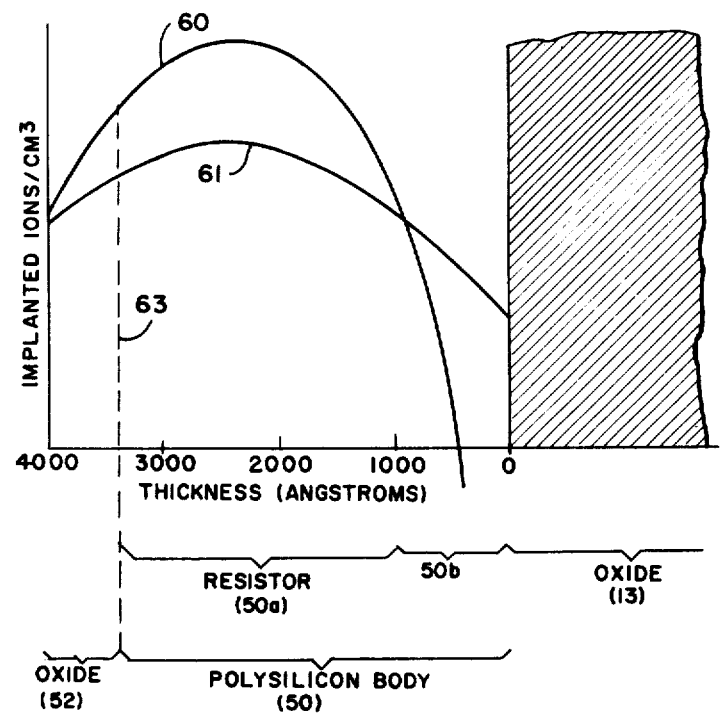
FIG. 5 shows the implanted ion density profiles in the polysilicon.

A polysilicon layer is then formed over the silicon oxide covering the entire wafer surface by a standard low pressure chemical vapor deposition step. Briefly, this step includes placing the wafer in a vacuum hotwall furnace, drawing a vacuum, raising the temperature to about 625° C. and admitting silane (SiH$_4$) gas to a subatmospheric pressure. A polycrystalline layer is produced having a thickness of about 4000 angstroms. Boron ions are then implanted into the surface of the polysilicon, using a boron dopant such as boron or BF$_2$ at 150 Kev. The resulting density of implanted boron ions is depicted in FIG. 5 by curve 60 which at about 1500 angstroms from the outer surface of the polysilicon layer reaches a peak density of about $5 \times 18/cm^3$. The polysilicon sheet covering the whole of the surface of the epitaxial layer provides a highly efficient mask, preventing the penetration of the relatively large quantity ($5 \times 10^{14}$ ions/cm$^2$) of the bombarding ions during the ion implantation into the underying oxide 13 and into the underlying devices.

Then, by a standard photoresist and etching step, the polysilicon is selectively removed to define the lateral extent of the resistors, all of which are about 10 microns wide but of various particular lengths to determine the final resistance values. The resistors are preferably located where the underlying silicon oxide layer portions have substantial thickness, e.g. greater than about 0.5/micron, and are uniformly thick, such as over the base 32 or over the isolation wall 12, or over unaltered portions of the epitaxial layer.

Standard photolithographic and oxide etching steps are then performed to remove all oxide from the gate regions of the MOS transistors. The critical gate oxidation is now performed in these regions by heating in dry oxygen at 1000° C. This oxidation cycle also serves as the major part of the dopants drive-in cycle producing the ion density profile 61, as well as producing the protective oxide 52 over the polysilicon resistors and furthermore serving to anneal the ion-implanted polysilicon body 50.

The growth of the silicon dioxide layer 52 results in the consumption of about 600 angstroms of the polysilicon layer, moving the outer surface of the polysilicon layer inward as represented by the dashed line 63 in FIG. 5. Now about 90% of the implanted boron atoms in the 3000 angstrom thick polysilicon layer 50 lie within the outer 2000 angstroms of layer 50 defining the layer 50a which carries about 10 times the current carried in the parallel layer 50b.

Figure 6:
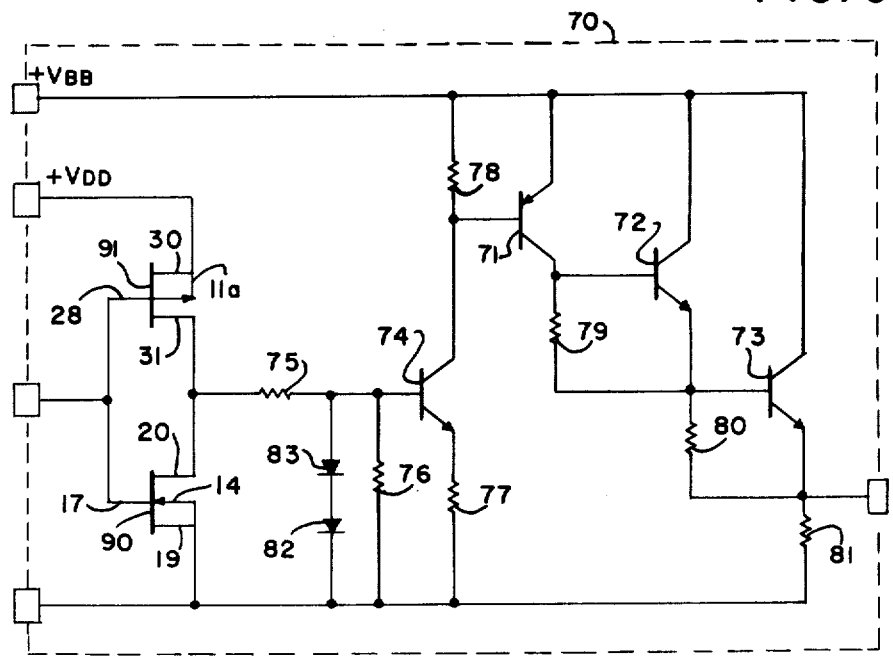
FIG. 6 shows a circuit diagram representing a portion of the integrated circuit of this invention.

Holes are then photolithiographically opened in the oxide and a sheet of aluminum is deposited by vacuum evaporation over the oxide and through the holes to contact the doped regions at the desired areas. In a further photolithographic step, the aluminum is selectively removed to leave a network of conductors that make the desired electrical connections as is schematically illustrated in FIG. 6. Finally, a layer of phosphorous-doped glass is deposited by a low temperature chemical vapor deposition step over the oxide layers 13 and 52 and over the aluminum conductors (e.g. 30, 38, 45 and 53).

An integrated circuit 70, shown in FIG. 6, made in accordance with this invention has a PNP transistor 71, NPN transistors 71, 72, 73 and 74, ion implanted polysilicon resistors 75, 76, 77, 78, 79, 80 and 81, and two diodes 82 and 83, all forming a driver circuit portion rated for operation at a supply voltage, $V_{BB}$, of 60 to 80 volts. Resistors 75, 76, 77, 78, 79, 80 and 81 have resistance values of 10K, 30K, 2K, 30K, 27K, 15K, and 100K, respectively. Integrated circuit 70 also has a pair of C-MOS transistors 90 and 91, corresponding to the N-channel and P-channel transistors of FIG. 1, respectively.

Such an integrated circuit has been made containing hundreds of MOS transistors plus ten of the circuits illustrated in FIG. 6 including sixty polysilicon resistors. This chip is designed to provide a 10 bit serial input, parallel output driver for a fluorescent display.

What is claimed is:

1. An integrated logic-controlled driver circuit comprising a silicon crystal wafer of P-type; and N-type epitaxial layer having been grown on a face of said wafer; electrical components being formed in said epitaxial layer and including a complimentary pair of MOS transistors, a PNP and an NPN transistor; an insulative film on the surface of said epitaxial layer; a polysilicon resistor formed over said insulative film, said PNP transistor, NPN transistor and pair of MOS transistors being in three pockets of said epitaxial layer, respectively, that are electrically isolated from one another, the N-channel transistor of said MOS pair including a P-type well region extending completely through said epitaxial layer, said N-channel transistor further including a shallow heavily doped annular surface region of P-type at the interface between said well region and the surrounding of said N-type epitaxial layer, the P-channel transistor of said MOS pair having spaced P-type source and drain regions at said surface, said PNP transistor having at said surface a P-type emitter region and spaced outwardly therefrom an annular P-type collector region, said NPN transistor having at said surface a P-type base region and an N-type emitter region formed therein, said resistor being comprised of a polysilicon layer containing ion implanted impurities extending from the outer surface thereof substantially only part way through said polysilicon layer, and said PNP and NPN transistors and said resistor comprising a high voltage driver portion, and said N-channel and P-channel transistors comprising a logic portion, respectively, of said logic-controlled driver circuit.

2. The integrated circuit of claim 1 wherein said insulative film is a silicon dioxide film, and additionally comprising a silicon dioxide film over said resistor body having the same thickness as that portion of said silicon doxide film which covers the channel regions between the sources and drains of said MOS transistors.

3. The integrated circuit of claim 1 additionally comprising P-type isolation walls extending through said epitaxial layer to provide said electrical isolation between said pockets.

4. The integrated circuit of claim 3 wherein said walls are comprised of a buried layer portion extending upward from said wafer partway through said epitaxial layer, a downward portion extending from said epitaxial surface part way through said epitaxial layer and overlapping said buried layer portion, and a shallow contact portion at said surface overlapping said downward portion.

5. The integrated circuit of claim 4 wherein said P-type well is comprised of a buried layer portion of the same upward extension into said epitaxial layer and the same concentration of P-type impurities as that of said buried layer isolation wall portion; and a downward portion having the same downward extension and the same concentration of P-type impurities as that of said downward diffused wall portion.

6. The integrated circuit of claim 3 wherein said base region of said NPN transistor, said emitter and said collector of said PNP transistor and said annular well-epitaxial layer interface region of said N-channel transistor have the same downward extensions and the same P-type impurity concentrations as that of said shallow contact portion of said isolation wall.

7. The integrated circuit of claim 1 wherein said PNP transistor, NPN transistor and polysilicon resistor are connected to form a standard power driver circuit and said MOS transistors are connected to form a standard C-MOS logic switching circuit, the output of said C-MOS circuit being connected to the input of said driver circuit.

* * * * *